(12) United States Patent
Agarwal et al.

(10) Patent No.: US 8,669,166 B1
(45) Date of Patent: Mar. 11, 2014

(54) METHODS OF THINNING AND/OR DICING SEMICONDUCTING SUBSTRATES HAVING INTEGRATED CIRCUIT PRODUCTS FORMED THEREON

(75) Inventors: Rahul Agarwal, Waterford, NY (US); Ramakanth Alapati, Rexford, NY (US); Jon Greenwood, Saratoga Springs, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/585,974

(22) Filed: Aug. 15, 2012

(51) Int. Cl.
*H01L 21/78* (2006.01)
*H01L 21/02* (2006.01)
*H01L 21/683* (2006.01)

(52) U.S. Cl.
USPC ........... 438/462; 438/795; 438/459; 438/308; 438/378; 438/977; 257/E33.004; 257/E21.297; 257/117; 257/620; 257/171

(58) Field of Classification Search
CPC .............. H01L 21/02021; H01L 21/78; H01L 21/6836
USPC ........... 438/462, 459, 977, 96, 766, 482, 966, 438/161, 463, 473, 308, 378, 502, 795, 438/949; 257/E33.004, E21.297, 117, 620, 257/171, 452, 483
See application file for complete search history.

(56) References Cited

U.S. PATENT DOCUMENTS

| | | | |
|---|---|---|---|
| 7,179,722 B2 * | 2/2007 | Murata et al. ................. | 438/460 |
| 7,682,224 B2 * | 3/2010 | Kimura et al. ................. | 451/41 |
| 7,741,701 B2 * | 6/2010 | Mahle et al. .................. | 257/620 |
| 8,486,806 B2 * | 7/2013 | Hirosawa ...................... | 438/463 |
| 2005/0003633 A1 * | 1/2005 | Mahle et al. .................. | 438/463 |
| 2005/0029239 A1 * | 2/2005 | Matsumoto et al. ..... | 219/121.72 |
| 2005/0070035 A1 * | 3/2005 | Yazaki et al. .................. | 438/22 |
| 2006/0049487 A1 * | 3/2006 | Sato et al. ..................... | 257/620 |
| 2006/0094246 A1 * | 5/2006 | Whitefield et al. ........... | 438/725 |
| 2006/0151450 A1 * | 7/2006 | You et al. ................. | 219/121.67 |
| 2006/0189034 A1 * | 8/2006 | Tanabe et al. ................. | 438/117 |
| 2006/0228908 A1 * | 10/2006 | Chung et al. .................. | 438/795 |
| 2006/0249816 A1 * | 11/2006 | Li et al. ......................... | 257/618 |
| 2007/0155131 A1 * | 7/2007 | Contes .......................... | 438/458 |
| 2007/0293056 A1 * | 12/2007 | Setsuhara et al. ............. | 438/795 |
| 2008/0160724 A1 * | 7/2008 | Song et al. .................... | 438/462 |
| 2008/0203538 A1 * | 8/2008 | Kumakawa et al. .......... | 257/620 |
| 2008/0286943 A1 * | 11/2008 | Nishio ........................... | 438/460 |
| 2010/0264423 A1 * | 10/2010 | Wood et al. ................... | 257/75 |
| 2011/0212596 A1 * | 9/2011 | Shimomura et al. .......... | 438/458 |
| 2012/0047956 A1 * | 3/2012 | Li .................................. | 65/112 |
| 2012/0058623 A1 * | 3/2012 | Hsieh ............................. | 438/459 |
| 2012/0061010 A1 * | 3/2012 | Gokita .......................... | 156/154 |
| 2012/0175652 A1 * | 7/2012 | Chyr et al. .................... | 257/98 |
| 2013/0164914 A1 * | 6/2013 | Sekiya .......................... | 438/462 |

* cited by examiner

*Primary Examiner* — Jarrett Stark
*Assistant Examiner* — Bitew Dinke
(74) *Attorney, Agent, or Firm* — Amerson Law Firm, PLLC

(57) ABSTRACT

One illustrative method disclosed herein includes forming a plurality of die above a crystalline semiconducting substrate, irradiating and cooling an edge region of the substrate to form an amorphous region in the edge region of the substrate and, after forming the amorphous region, performing at least one process operation to reduce the thickness of the substrate.

17 Claims, 10 Drawing Sheets

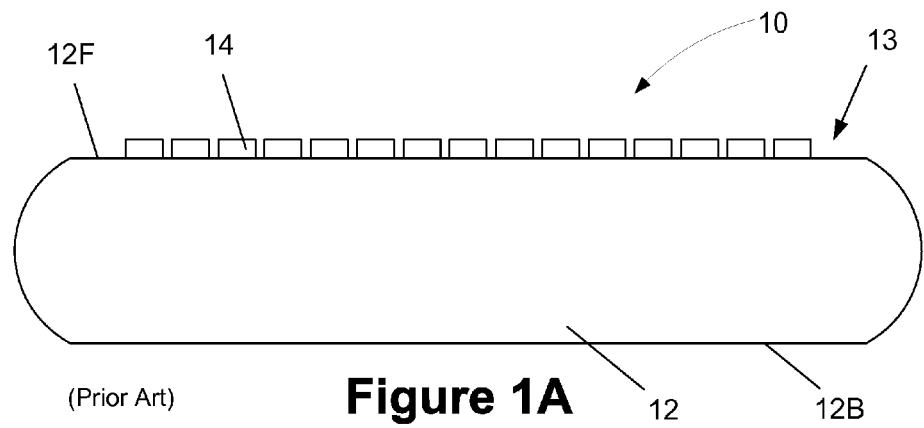
(Prior Art) Figure 1A
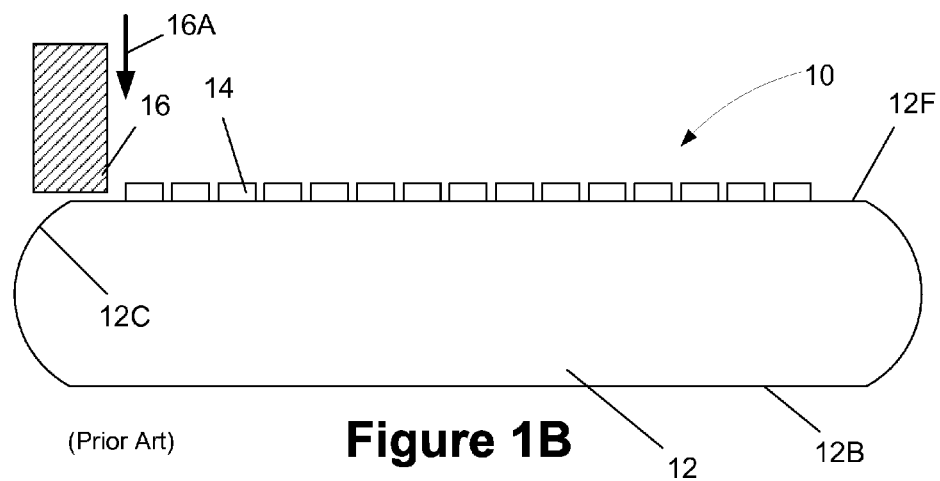
(Prior Art) Figure 1B
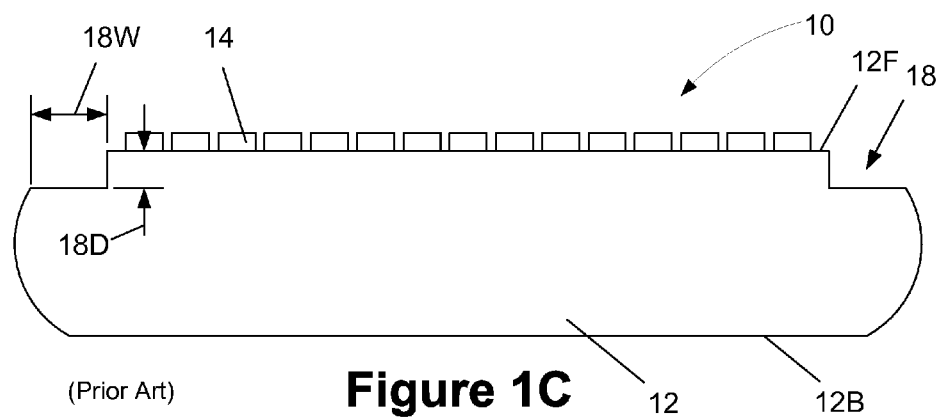
(Prior Art) Figure 1C

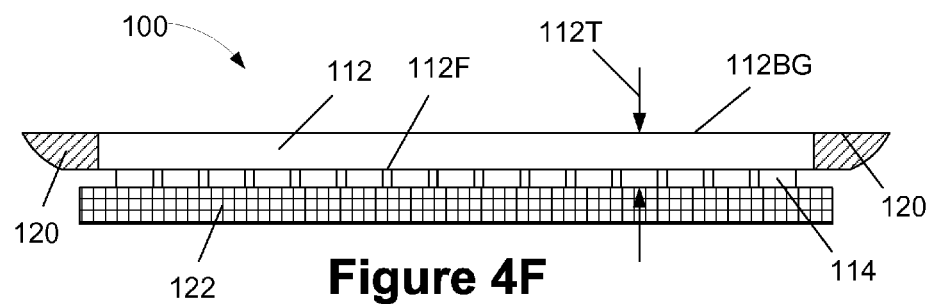
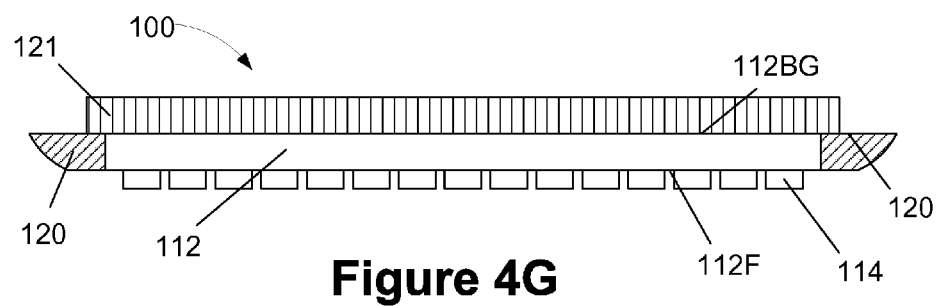

METHODS OF THINNING AND/OR DICING
SEMICONDUCTING SUBSTRATES HAVING
INTEGRATED CIRCUIT PRODUCTS
FORMED THEREON

BACKGROUND OF THE INVENTION

1. Field of the Invention

Generally, the present disclosure relates to the manufacture of sophisticated semiconductor devices, and, more specifically, to various methods of thinning and/or separating semiconducting substrates having integrated circuit products formed thereon.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout. Field effect transistors (NFET and PFET transistors) represent one important type of circuit element that substantially determines performance of such integrated circuits. During the fabrication of complex integrated circuits using, for instance, MOS technology, millions of transistors, e.g., NFET transistors and/or PFET transistors, are formed on a substrate including a crystalline semiconductor layer. In recent years, the device features of modern, ultrahigh density integrated circuits have been steadily decreasing in size in an effort to enhance the overall speed, performance and functionality of the circuit. As a result, the semiconductor industry has experienced tremendous growth due to the significant and ongoing improvements in integration density of a variety of electronic components, such as transistors, capacitors, diodes and the like. These improvements have primarily come about due to a persistent and successful effort to reduce the critical dimension—i.e., minimum feature size—of components, directly resulting in the ability of process designers to integrate more and more components into a given area of a semiconductor chip. As device features have been aggressively reduced, and more semiconductor components are being fit onto the surface of a single chip, the required number of electrical interconnects necessary for creating the "wiring" for the integrated circuit has dramatically increased. As a result, the overall circuit layout has become more complex and more densely-packed. Furthermore, even though improvements in photolithography processes have yielded significant increases in the integration densities of 2D circuit designs, simple reduction in feature size is rapidly approaching the limits of what can presently be achieved in only two dimensions.

As the number of electronic devices on a single chip rapidly increases, three-dimensional (3D) integrated circuit layouts, or stacked chip design, have been utilized for some semiconductor devices in an effort to overcome some of the feature size and density limitations associated with 2D layouts. Typically, in a 3D integrated circuit design, two or more semiconductor die are bonded together, and electrical connections are formed between each die. One method of facilitating the chip-to-chip electrical connections is by the use of so-called through-silicon vias, or TSV's. A TSV is a vertical electrical connection that passes completely through a silicon wafer or die, allowing for more simplified interconnection of vertically aligned electronic devices, thereby significantly reducing integrated circuit layout complexity as well as the overall dimensions of a multi-chip circuit. A typical TSV may have a diameter that falls within the range of 6-100 µm or smaller, and, as technology advances, there is constant pressure to make them even smaller. Similarly, there is a constant pressure to reduce the overall thickness of the wafers that are used in manufacturing semiconductor devices. In general, very little of the starting thickness of a semiconducting substrate is actually used in making semiconductor devices, i.e., the depth of the device regions in the substrate may be less than 10 µm. Thus, a large percentage of the starting thickness of the substrate is essentially not needed for the integrated circuit device to perform electrically. However, a certain amount of the thickness of the original wafer is maintained to ensure that the integrated circuit can mechanically withstand packaging operations and withstand the intended commercial environment for the integrated circuit product. In many applications, e.g., cell phones and other portable consumer electronic devices, it is desirable that the substrate in the integrated circuit product be made as thin as possible to reduce the physical size and weight of the final consumer product.

FIGS. 1A-1F depict one illustrative method of thinning an illustrative wafer 10 after a plurality of illustrative integrated circuit products 14 have been formed on the substrate 12. As shown in FIG. 1A, the substrate 12 has a front side 12F and a back side 12B. The integrated circuit products or die 14 are formed on the front side 12F of the substrate 12. Typically, the substrate 12 may have a starting thickness, as received from the wafer supplier, of about 775 µm. Ultimately, depending upon the particular application, prior to performing dicing operations to separate the plurality of die 14, the substrate 12 will be thinned to a final thickness that may fall within the range of about 20-200 µm. Typically, the die 14 are not formed on the very outer edge region 13 of the substrate 12, which may have a radial width of about 2 mm.

In this embodiment, as shown in FIG. 1B, the thinning process begins by using a dicing saw (not shown) and a schematically depicted dicing saw blade 16 to remove portions of the substrate 12 near the edge of the wafer 10. As depicted, the substrate 12 has curved outer edges 12C. In general, the spinning saw blade 16 is moved downward, as indicated by the arrow 16A, as the substrate 12 is rotated on a wafer stage (not shown). As shown in FIG. 1C, the process results in the formation of recesses 18 adjacent the edge of the substrate 12. The depth 18D and width 18W of the recesses 18 may vary depending upon the application and the final desired thickness of the substrate 12. Typically, the depth of the recesses 18 is slightly greater than the desired final thickness of the substrate 12. In one example, the depth 18D may fall within the range of about 100-400 µm and the width 18W may fall within the range of about 200-700 µm. In effect, the recesses 18 are formed to remove the curved outer edges 12C of the substrate 12 for a depth that is greater than the final desired thickness of the substrate 12.

Next, in this example, as shown in FIG. 1D, a layer of back grinding tape 20 is attached to the die 14 on the front side 12F of the wafer 10. Alternatively, a support wafer (not shown) could be attached to the front side 12F of the wafer 10 before grinding processes begin. Then, as shown in FIG. 1E, a schematically depicted grinding wheel 22 is used to grind the back side 12B of the substrate 12 to reduce the overall thickness of the substrate 12. FIG. 1F depicts the wafer 10 after the grinding process has been completed. At this point, the substrate 12 has a ground back surface 12BG and it has been thinned to a final desired thickness 12T. The final desired thickness 12T may range from about 20-100 µm depending upon the particular application, and further reductions in the final thickness 12T are anticipated for future generation devices. Next, as shown in FIG. 1G, the back grinding tape 20 has been removed and a layer of dicing tape 21 is attached to the ground back surface 12BG of the substrate 12. At the point of fabrication depicted in FIG. 1G, the dicing operations may be performed from the front side 12F of the substrate 12 to physically separate the illustrative die 14 formed on the substrate 12. Thereafter, the individual die are tested and packaged for commercial sale.

As wafers are thinned to final thicknesses of around 100 μm or less, there is an increased risk of chipping and cracking at the edge of the wafer. The edge trimming process described above in FIGS. 1B-1C is performed before the back-side grinding of the wafer in an effort to reduce the risk of generating cracks and chips at the edge of the wafer. However, the edge trimming process is generally a "dirty" process that creates many particles that may contaminate one or more of the die 14. Lastly, crystalline silicon wafers, the predominant form of semiconducting substrates used in manufacturing integrated circuit products, is typically a relatively brittle material wherein cracks or chips, once initiated, may, in some cases, propagate without an increase in the stress applied to the wafer.

The present disclosure is directed to various methods of thinning and/or separating semiconducting substrates having integrated circuit products formed thereon that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of thinning and/or separating semiconducting substrates having integrated circuit products formed thereon. One illustrative method disclosed herein includes forming a plurality of die above a crystalline semiconducting substrate, irradiating and cooling an edge region of the substrate to form an amorphous region in the edge region of the substrate and, after forming the amorphous region, performing at least one process operation to reduce the thickness of the substrate.

Another illustrative method disclosed herein includes forming a plurality of die above a crystalline semiconducting substrate, wherein the die are separated by a scribe line region, performing at least one thinning process operation to reduce the thickness of the substrate to a final desired thickness, after thinning the substrate, irradiating and cooling at least a portion of the scribe line region to form an amorphous region in the scribe line region and, after forming the amorphous region, cutting through the scribe line region to separate the plurality of die.

BRIEF DESCRIPTION OF THE DRAWINGS

The disclosure may be understood by reference to the following description taken in conjunction with the accompanying drawings, in which like reference numerals identify like elements, and in which:

FIGS. 1A-1G depict one illustrative prior art process flow for thinning a substrate;

FIGS. 4A-4G depict one illustrative method disclosed herein of thinning a semiconducting substrate having integrated circuit products formed thereon.

Figure 1D:
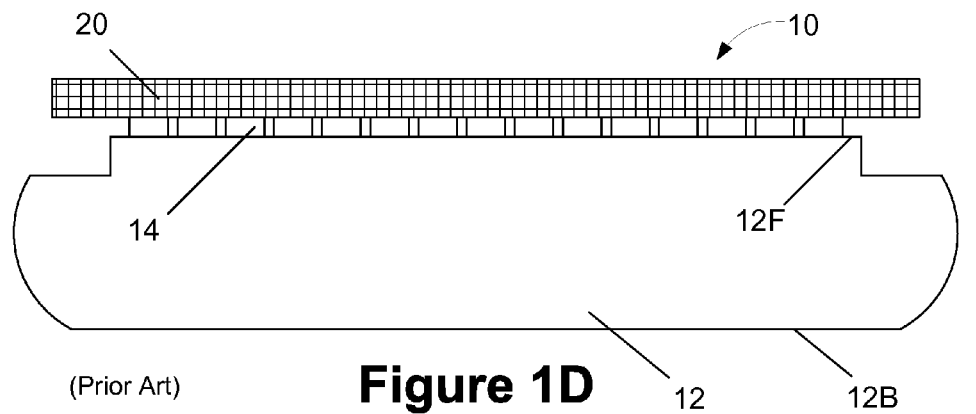
Figure 1E:
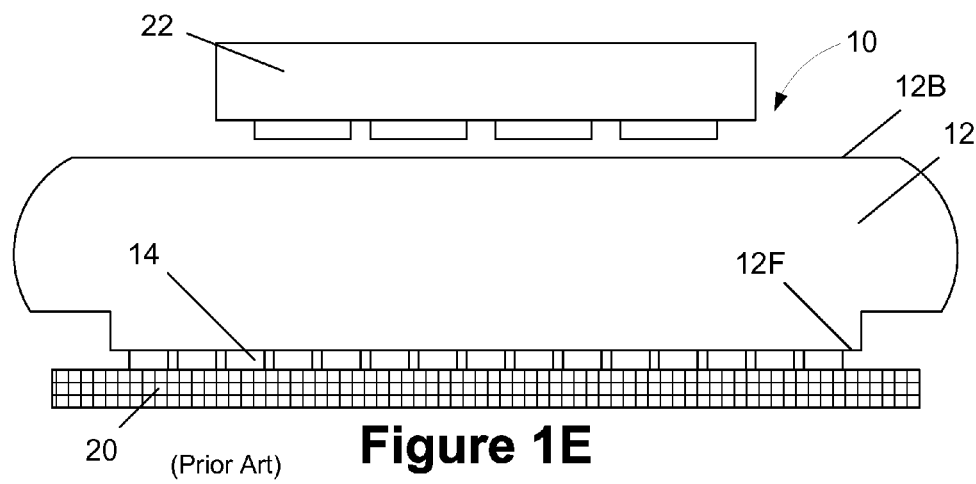
Figure 1F:
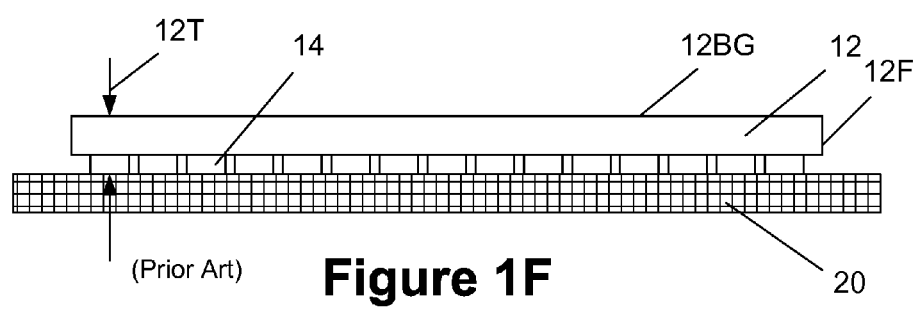
Figure 1G:
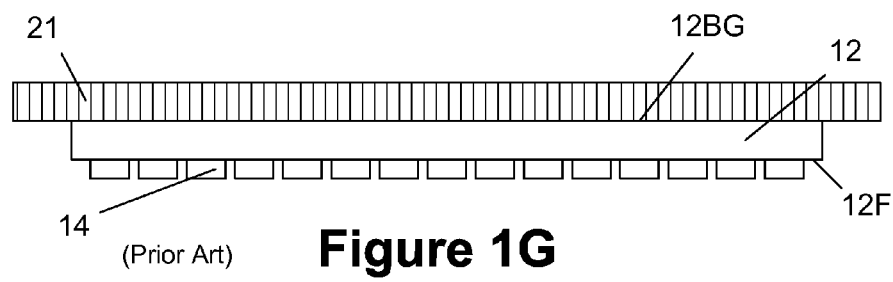

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of thinning and/or separating semiconducting substrates having integrated circuit products formed thereon. As will be readily apparent to those skilled in the art upon a complete reading of the present application, the methods disclosed herein may be employed with a variety of different technologies, e.g., NMOS, PMOS, CMOS, etc., and in manufacturing a variety of different devices, including, but not limited to, logic devices, memory devices, etc. With reference to the attached figures, various illustrative embodiments of the methods and devices disclosed herein will now be described in more detail.

In general, as it relates to one of the inventions disclosed herein, the inventors have discovered that by forming regions of amorphous silicon near the edge region of a silicon wafer, the risk of crack or chip formation during wafer thinning processes may be reduced. More specifically, by heating and quickly cooling the edge region of the substrate, a portion of the edge region of the crystalline silicon substrate may be converted to regions of amorphous silicon which is more ductile than crystalline silicon. Thus, as compared to crystalline silicon, it is more difficult to crack or chip the amorphous silicon edge region disclosed herein. Moreover, even if a crack or chip is initiated in the amorphous silicon edge region, the amorphous silicon tends to be more resistant to crack extension or propagation as compared to crystalline silicon.

Figure 2A:
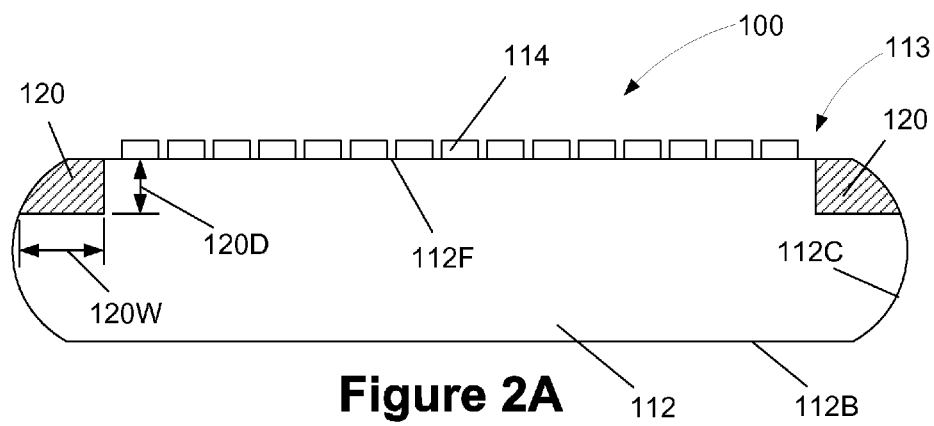
FIGS. 2A-2C depict one illustrative example of a substrate that may be processed so as to form amorphous silicon regions near the edge of the substrate prior to thinning of the substrate.
Figure 2B:
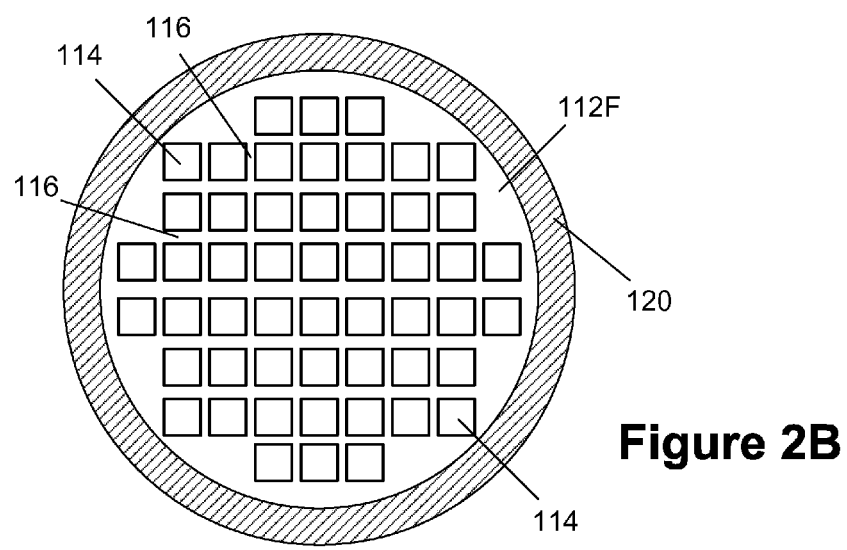
Figure 2C:
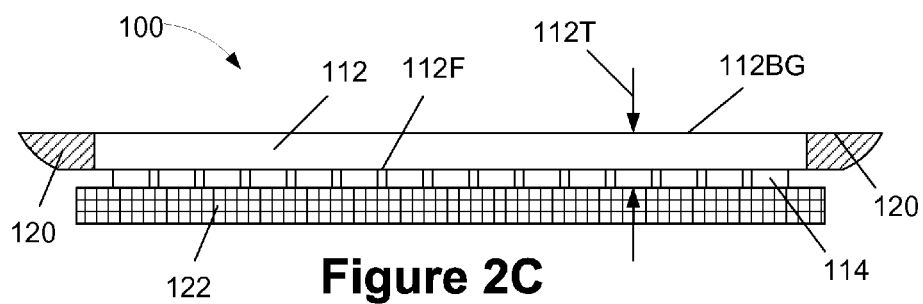

FIGS. 2A-2C depict one illustrative example of a wafer that may be processed so as to form amorphous silicon regions near the edge of the wafer prior to thinning of the wafer. As shown therein, the wafer 100 is comprised of a semiconducting substrate 112 having a plurality of integrated circuit products 114 formed thereon. The integrated circuit products are separated by illustrative scribe lines 116. The substrate 112 may have a variety of configurations, such as the depicted bulk silicon configuration. The substrate 112 may also have a silicon-on-insulator (SOI) configuration that includes a bulk silicon layer, a buried insulation layer and an active layer, wherein semiconductor devices are formed in and above the active layer. The substrate 112 may be made of silicon or it may be made of materials other than silicon. Thus, the terms "substrate" or "semiconducting substrate" should be understood to cover all semiconducting materials and all forms of such materials.

The substrate 112 has a front side 112F, a back side 112B and curved outer edges 112C. At the point of fabrication depicted in FIG. 2A, the illustrative integrated circuit products 114 have been formed on the front side 112F of the substrate 112. The integrated circuit products 114 described and depicted herein are intended to be representative in nature, i.e., they are intended to be representative of any type of product or device that contains integrated circuits. Thus, the inventions disclosed herein should not be considered to be limited to any particular type of integrated circuit product. Typically, the substrate 112 may have a starting thickness, as received from the wafer supplier, of about 775 µm. Ultimately, depending upon the particular application, prior to performing dicing operations to separate the plurality of die 114, the substrate 112 will be thinned to a final thickness that may fall within the range of about 20-100 µm, or less. As noted previously, the die 114 are not typically formed on the very outer edge region 113 of the substrate 112, which may have a radial width of about 2 mm.

As depicted in FIGS. 2A-2B, an amorphous silicon region 120 has been formed in the substrate 112 by performing the heating and cooling process mentioned above. The depth 120D and width 120W of the amorphous silicon region 120 may vary depending upon the application and the final desired thickness of the substrate 112. Typically, the depth 120D of the amorphous silicon region 120 is slightly greater than the desired final thickness of the substrate 112. In one example, the depth 120D may fall within the range of about 100-400 µm and the width 120W may fall within the range of about 100-700 µm. In effect, the amorphous silicon region 120 is formed to make the edge region 113 of the substrate more ductile and, therefore, more resistant to crack/chip formation and propagation.

FIG. 2C depicts the wafer 100 after a layer of back grinding tape 122 has been attached to the die 114 on the front side 112F of the wafer 100 and after the grinding process has been complete. At this point, the substrate 112 has a ground back surface 112BG and it has been thinned to a final desired thickness 112T. The final desired thickness 112T may range from about 20-100 µm depending upon the particular application. At the point depicted in FIG. 2C, the dicing operations may be performed to physically separate the illustrative die 114 formed on the substrate 112. Thereafter, the individual die may be tested and packaged for commercial sale. Although not depicted in the drawings, if desired, the edge trimming process described above with respect to FIGS. 1B-1C may be performed on the edge regions 113 after the amorphous region 120 is formed. In such a case, all or a portion of the amorphous region 120 depicted in FIG. 2C would not be present.

Figure 3A:
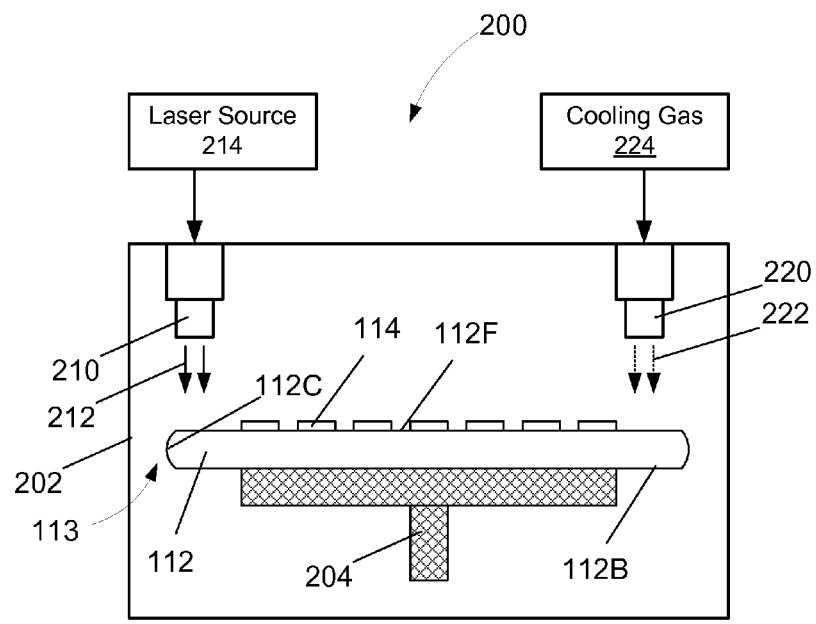
FIGS. 3A-3B schematically depict one illustrative example of a novel system disclosed herein that may be employed to practice the methods described herein.
Figure 3B:
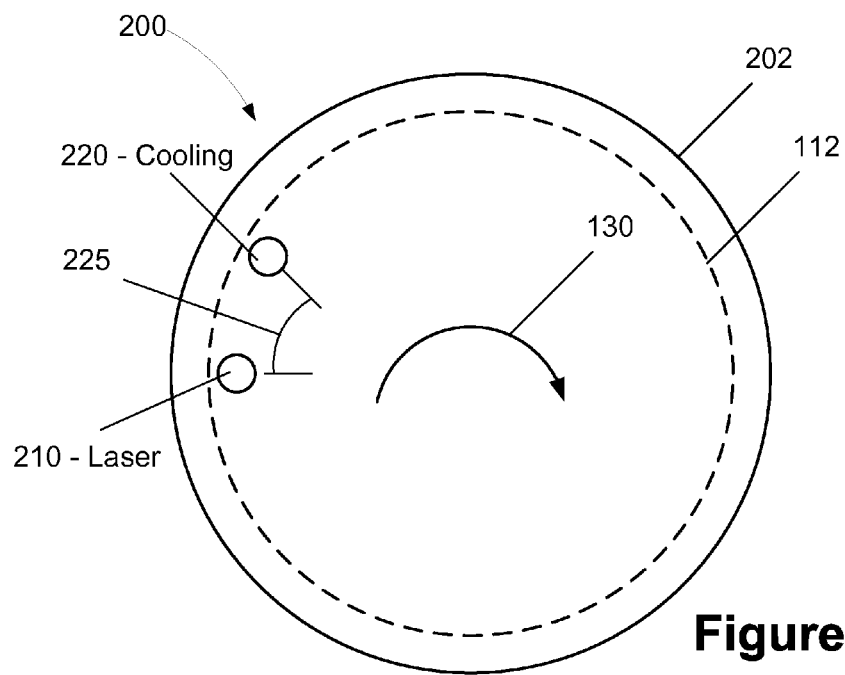

FIGS. 3A-3B schematically depict one illustrative example of a novel system 200 disclosed herein that may be employed to practice the various methods described herein. The system 200 is generally comprised of a process chamber 202, a wafer stage 204, a schematically depicted laser device 210 and a schematically depicted cooling device 220. The laser device 210 is operatively coupled to a source of radiation 214. The cooling device 220 is operatively coupled to a source of cooling fluid 224, e.g., a liquid or a gas. In this example, the substrate 112 is positioned on the wafer stage 204. FIG. 3B is a plan view of the system 200 that shows one illustrative example of the relative positioning of the laser device 210 and the cooling device 220. The angular spacing 225 between the laser device 210 and the cooling device 220 may vary depending upon the particular application. The laser device 210 may take a variety of forms, e.g., multiple or single lasers, etc. The cooling device 220 may also take a variety of forms, e.g., one or more nozzles, shower heads, etc. Although not depicted in the drawings, the system 200 will also include various utilities and components that are necessary for the system 200 to perform its intended functions, e.g., various pumps, compressors, instrumentation, a motor to rotate the wafer stage, etc.

In general, the laser device 210 is adapted to irradiate, as depicted by the arrows 212, the edge region 113 of the substrate 112 including at least a portion of the curved surface 112C. The purpose of the laser device 210 is to create a locally annealed region (not shown in FIG. 3B) in the substrate 112. The cooling device 220 is adapted to rapidly cool the locally annealed region. During the annealing/cooling process, the substrate 112 is typically rotated relative to the laser device 210 and the cooling device 220. In the depicted example, the substrate 112 is rotated in a clock-wise direction, as depicted by the arrows 130 (see FIG. 3B). If desired, the substrate 112 may remain stationary while the laser device 210 and the cooling device 220 are rotated, or both the substrate 112 and the laser device 210 and the cooling device 220 may be rotating relative to one another at the same time. In other applications, the substrate 112 may be indexed relative to the laser device 210 and the cooling device 220 to a first stopping location where the substrate 112 may then be irradiated/cooled, then the laser device 210 and the cooling device 220 and/or the substrate 112 may again be indexed relative to one another to a second stopping location, etc.

In one illustrative example, the laser device 210 is a laser that is adapted to irradiate the substrate 112 with energy at wavelengths that fall within the range of about 249-10,600 nm, e.g., infrared radiation to ultraviolet radiation. Illustrative examples of specific lasers that may be employed as the laser device 210 are: a carbon dioxide-based layer ($\lambda$=10.6 µm); a ruby-based laser ($\lambda$=694 nm); Nd:YAG (neodymium-doped yttrium aluminum garnet) ($\lambda$=106 nm); an excimer-based laser ($\lambda$=249 nm), etc. The radiation 212 directed toward the substrate 112 may be either pulsed or continuous in nature, or a combination of both, the selection of which may depend upon a variety of factors, e.g., the rotational speed of the substrate 112 relative to the laser device 210, the desired depth of the locally annealed region, the type of laser employed, the distance from the laser source, etc. In one illustrative embodiment, the anneal process is performed using a relatively high-powered laser, e.g., 10-200 W, that irradiates the substrate 112 while there is relative movement between the laser device 210 and the substrate 112.

In one illustrative example, the cooling device 220 is adapted to direct a cooled fluid toward the locally annealed region in the substrate 112. In one illustrative embodiment, the fluid used in the cooling process may be liquid nitrogen, argon, jetted cold compressed air or water, etc. In general, the cooling device 220 is employed to cool the locally annealed region at a sufficient rate such that portioning and re-alignment of the atoms within the locally annealed region is prevented or at least greatly slowed, thereby forming the amorphous silicon region 120 (see FIG. 2A). The heating/cooling process is repeated as the substrate 112 passes under the laser device 210 and the cooling device 220. In one illustrative example, the fluid used by the cooling device 220 may be at a temperature that falls within the range of about −300 to −100 K, and it may be supplied so as to cause the locally annealed region to experience a local cooling rate of about $10^4$-$10^{10}$ K/s.

In the case where a twelve inch diameter wafer is rotated relative to the laser device 210 and the cooling device 220, the substrate 112 may be rotated at a rotational speed of about 100-1000 rev/min. Depending upon a variety of factors, e.g., the desired depth of the final amorphous silicon region 120, the strength of the laser device 210, the rate of cooling achieved by the cooling device 220, etc., the entire heating/cooling process to form the final amorphous silicon region 120 may take about 10-120 seconds to complete.

Figure 4A:
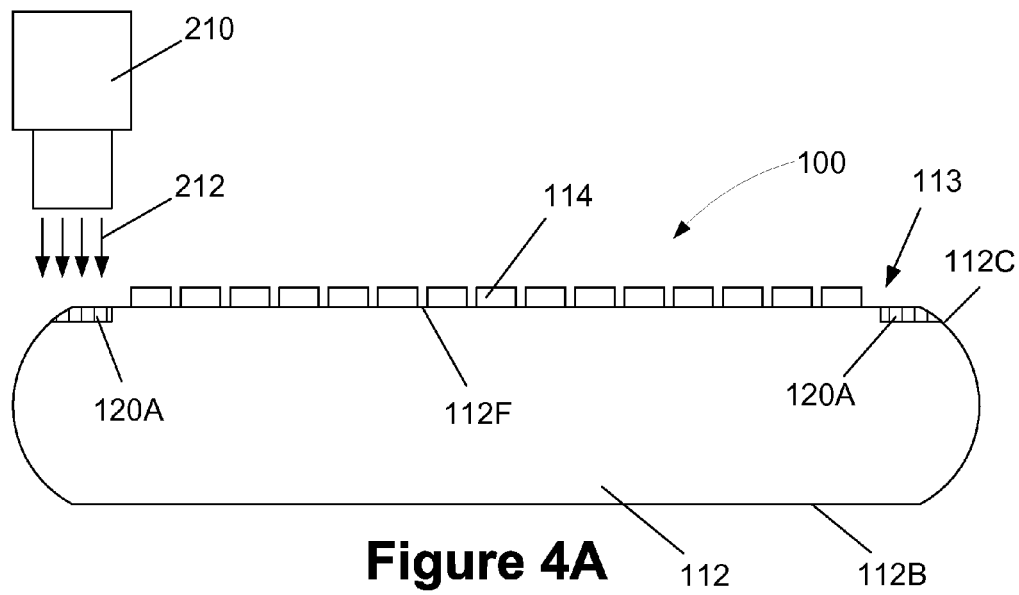
Figure 4B:
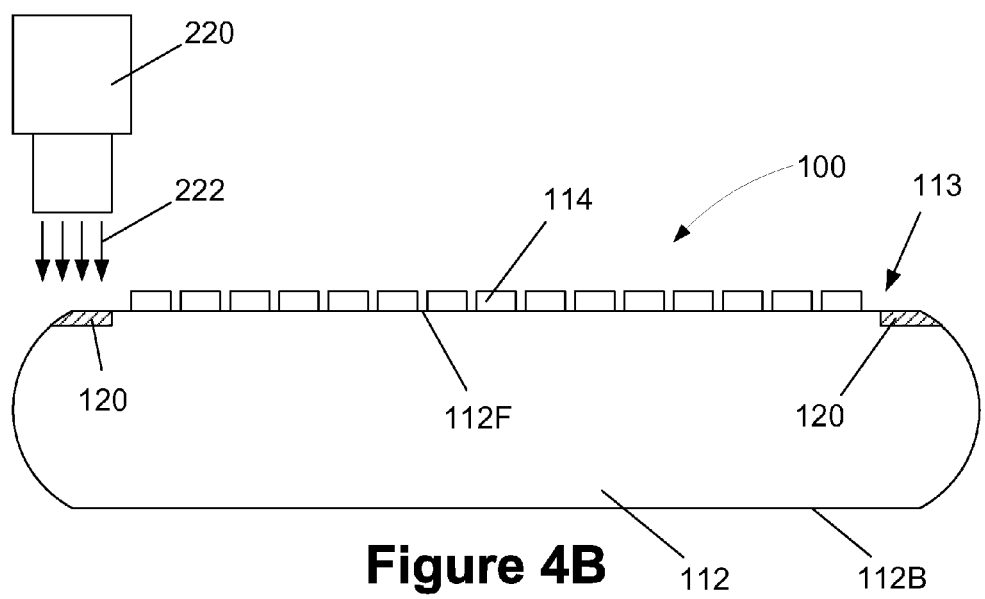
Figure 4C:
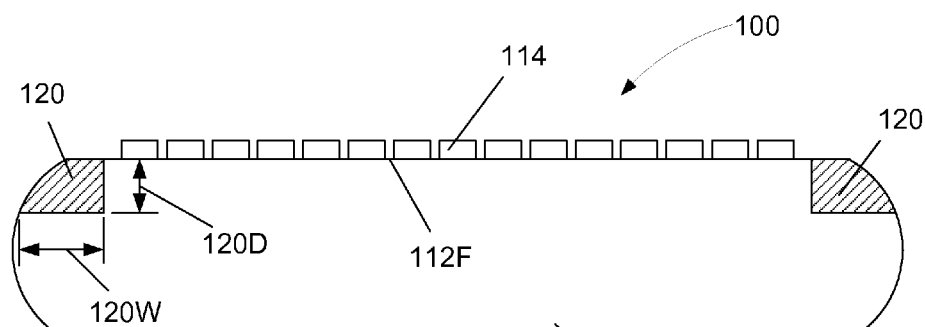
Figure 4D:
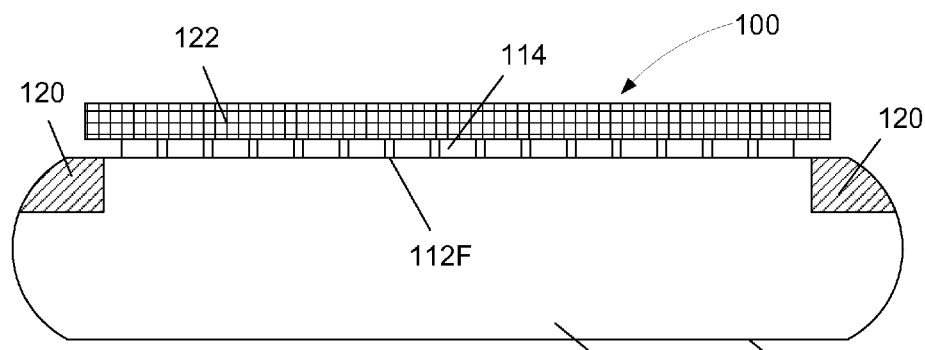
Figure 4E:
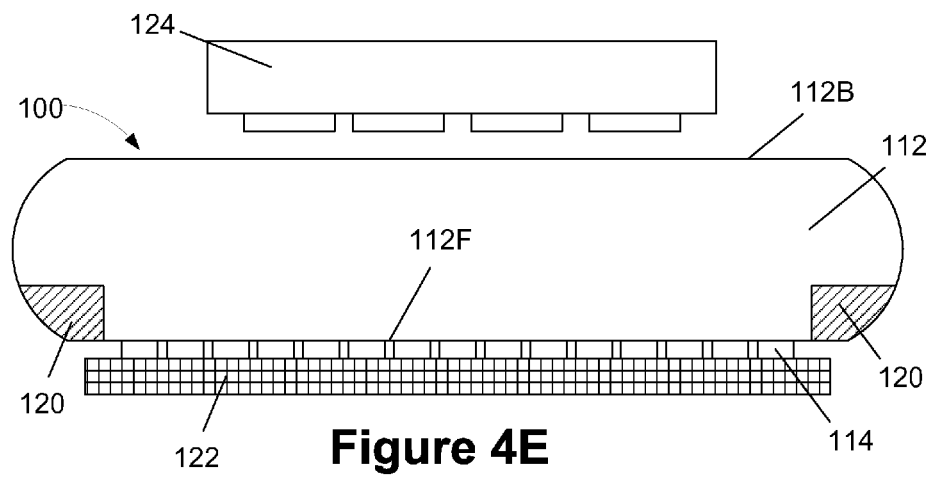

FIGS. 4A-4G depict one illustrative method disclosed herein of thinning a semiconducting substrate having integrated circuit products formed thereon. During the steps depicted in FIGS. 4A-4B, the substrate 112 is typically rotated relative to the laser device 210 and the cooling device 220. As shown in FIG. 4A, the laser device 210 irradiates the edge region 113 of the substrate 112, as depicted by the arrows 212, as the substrate 112 passes underneath. This anneal process results in the formation of an annealed portion 120A. Thereafter, as shown in FIG. 4B, as the substrate 112 continues its rotation, the cooling device 220 cools the previously annealed portion 120A in such a manner and at such a rate that amorphous region 120 is formed. This anneal/cooling process is repeated until such time as the amorphous region 120 reaches its final desired depth 120D, as depicted in FIG. 4C. Note that the various process parameters may need to change as the formation of the amorphous silicon regions progresses, e.g., the power used by the laser device 210 may need to be increased, the rate of cooling provided by the cooling device 220 may need to be increased, the rotational speed of the substrate 112 may need to be reduced, etc. Next, in this example, as shown in FIG. 4D, a layer of back grinding tape 122 is attached to the die 114 on the front side 112F of the wafer 100. Then, as shown in FIG. 4E, a schematically depicted grinding wheel 124 is used to grind the back side 112B of the substrate 112 to reduce the overall thickness of the substrate 112. FIG. 4F depicts the wafer 100 after the grinding process has been completed. At this point, the substrate 112 has a ground back surface 112BG and it has been thinned to a final desired thickness 112T. Next, as shown in FIG. 4G, the back grinding tape 122 has been removed and a layer of dicing tape 121 has been attached to the ground back surface 112BG of the substrate 112. At the point depicted in FIG. 4G, the dicing operations may be performed to physically separate the illustrative die 114 formed on the substrate 112. Thereafter, the individual die may be tested and packaged for commercial sale.

FIGS. 5A-5I depict another illustrative method disclosed herein of separating a semiconducting substrate into a plurality of individual die. As it relates to this illustrative method, the inventors have discovered that, by forming regions of amorphous silicon in the scribe lines after the wafer has been thinned, the risk of crack or chip formation and/or propagation during wafer dicing processes may be reduced. More specifically, by performing the heating and cooling processes described above on the scribe line regions 116 of the substrate 112, the scribe line regions 116 may be converted to regions of amorphous silicon which is more ductile than crystalline silicon.

Figure 5A:
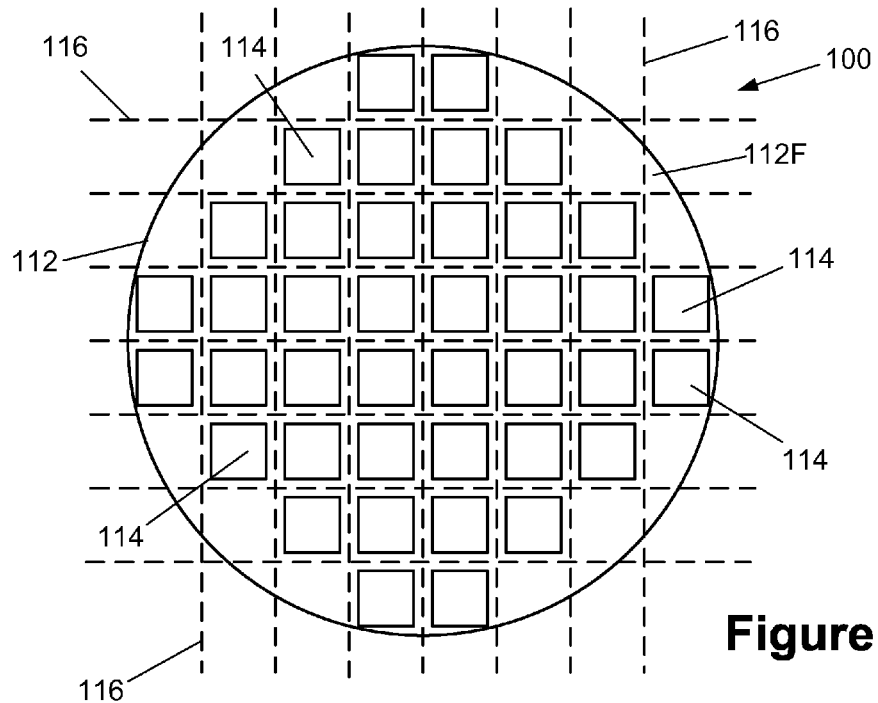
FIGS. 5A-5I depict another illustrative method disclosed herein of separating a semiconducting substrate into a plurality of individual die.
Figure 5B:
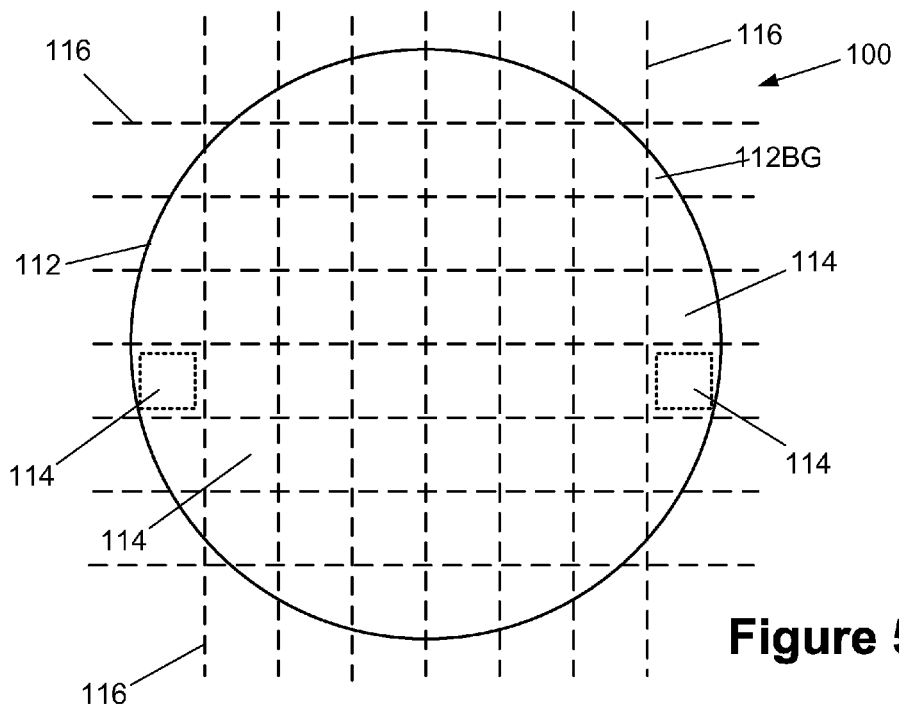

FIG. 5A is a plan view of the front side of an illustrative wafer 100. The wafer 100 is comprised of the substrate 112 and a plurality of the illustrative integrated circuit products 114 formed above the front side 112F of the substrate 112. Illustrative scribe lines 116 are depicted in FIG. 5A. FIG. 5B is a plan view of the back side of the wafer 100 after wafer thinning operations have been performed, as reflected by the ground back side 112BG of the thinned substrate 112. Two of the illustrative die 114 are depicted in dashed lines for context. The scribe lines 116 are also shown in FIG. 5B. As used herein and in the claims, the phase "scribe line region" should be understood to mean the area of the substrate that is positioned between two adjacent die 114 when they are formed on the wafer 100, e.g., the scribe line region spans the distance between two adjacent die 114.

Figure 5C:
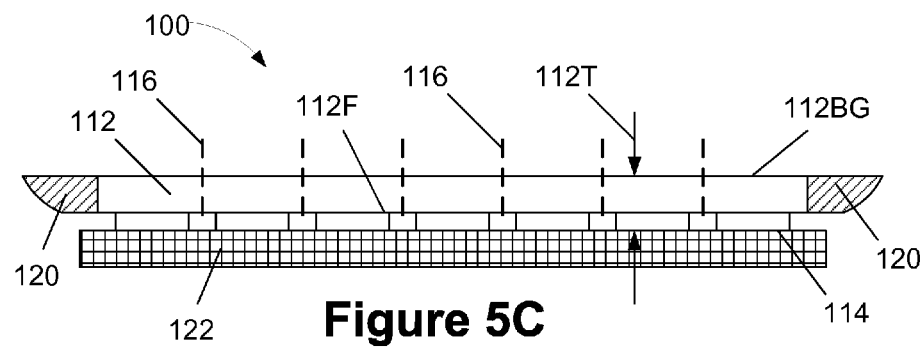

FIGS. 5C-5F depict one illustrative method disclosed herein of dicing a semiconducting substrate having a plurality of integrated circuit products or die 114 formed thereon. FIG. 5C depicts the wafer 100 after a layer of back grinding tape 122 has been attached to the die 114 on the front side 112F of the wafer 100 and after the grinding process has been complete. At this point, the substrate 112 has a ground back surface 112BG and it has been thinned to a final desired thickness 112T. In this example, the previously described amorphous regions 120 have been formed in the substrate 112. However, the formation of the amorphous regions 120 is not required to practice the aspects disclosed herein as it relates to the formation of amorphous silicon regions in a portion of the scribe line regions of the substrate.

Figure 5D:
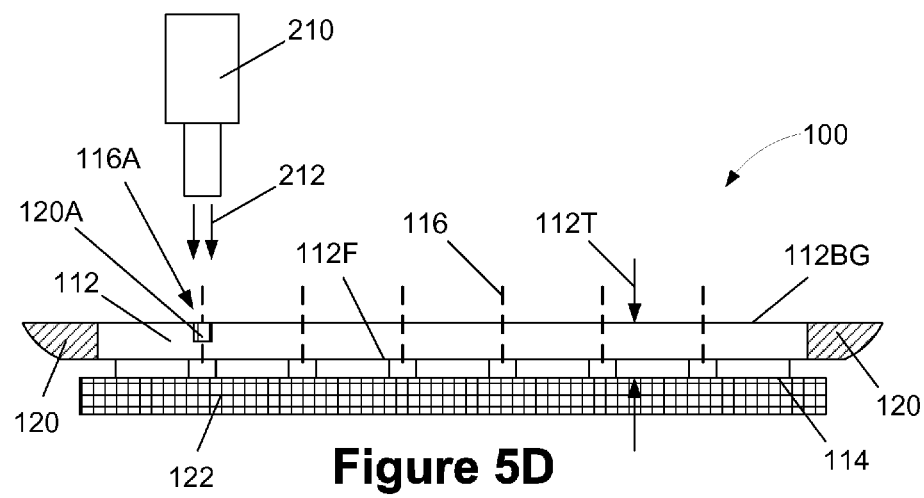
Figure 5E:
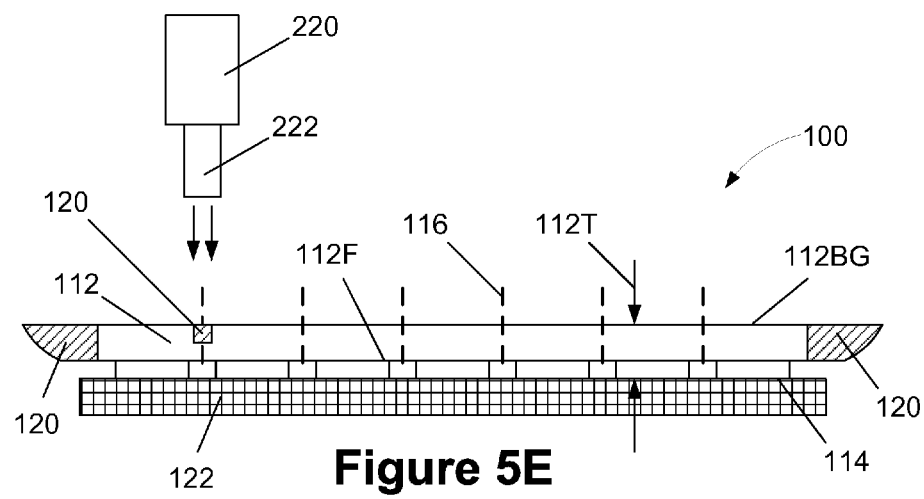

During the steps depicted in FIGS. 5D-5E, there is relative movement between the substrate 112 and the laser device 210/cooling device 220. Given that the scribe lines 116 are oriented in crossing, orthogonal-oriented lines, the relative movement between the substrate 112 and the laser device 210/cooling device 220 is translational in nature, e.g., movement in two directions. In one embodiment, the wafer stage may be comprised of various mechanical mechanisms to permit such translational movement of the substrate 112. Alternatively, the shape and configuration of the laser device 210/cooling device 220 may be such that they may be moved so as to process at least a portion of the scribe line regions of the device. For example, in one embodiment, the laser device 210/cooling device 220 may be a combination unit that essentially scans the substrate 112 in one direction first, e.g., the x-axis, and thereafter scans the wafer in a direction that is oriented ninety degrees relative to the x-axis. Many possible mechanical arrangements are possible to achieve the desired relative translational movement between the substrate 112 and the laser device 210/cooling device 220.

Figure 5F:
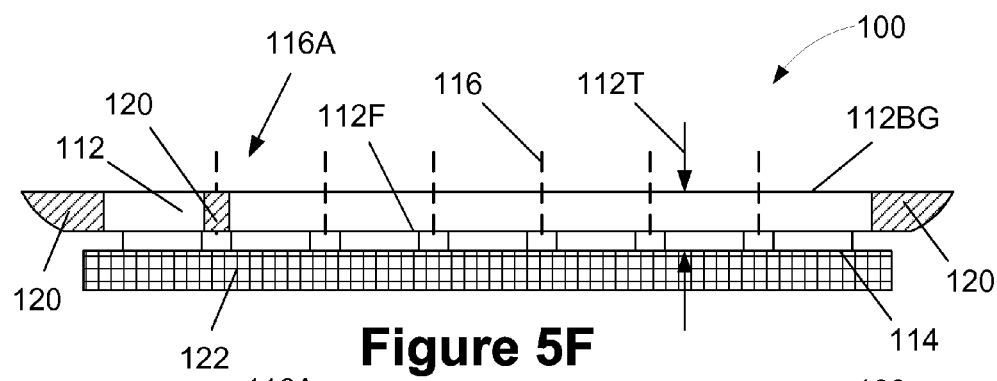

As shown in FIG. 5D, the laser device 210 irradiates the scribe line region 116 of the substrate 112, as depicted by the arrows 212, as the substrate 112 passes underneath. This anneal process results in the formation of an annealed portion 120A. Thereafter, as shown in FIG. 5E, as the substrate 112 continues its movement, the cooling device 220 cools the previously annealed portion 120A in such a manner and at such a rate that an amorphous region 120 is formed. This anneal/cooling process is repeated until such time as the amorphous region 120 extends through substantially the entire final thickness 112T of the thinned substrate 112, as depicted in FIG. 5F. In some applications, the thinned substrate 112 may be thin enough that the amorphous region 120 may be formed in a single pass over a given scribe line region 116A.

Figure 5G:
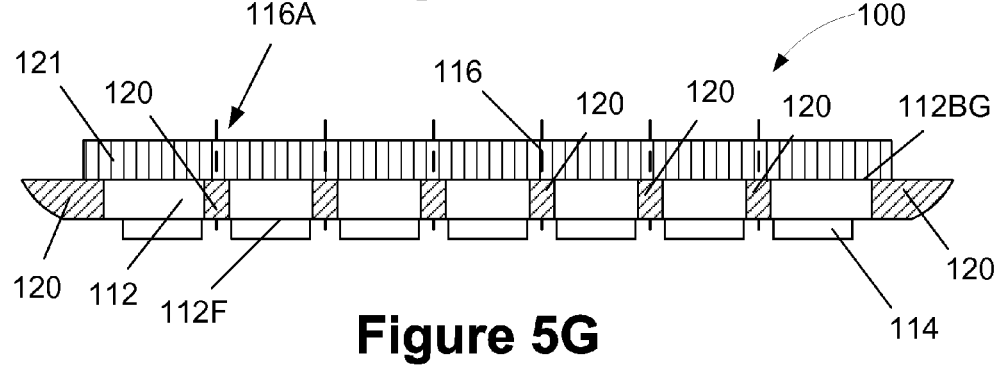
Figure 5H:
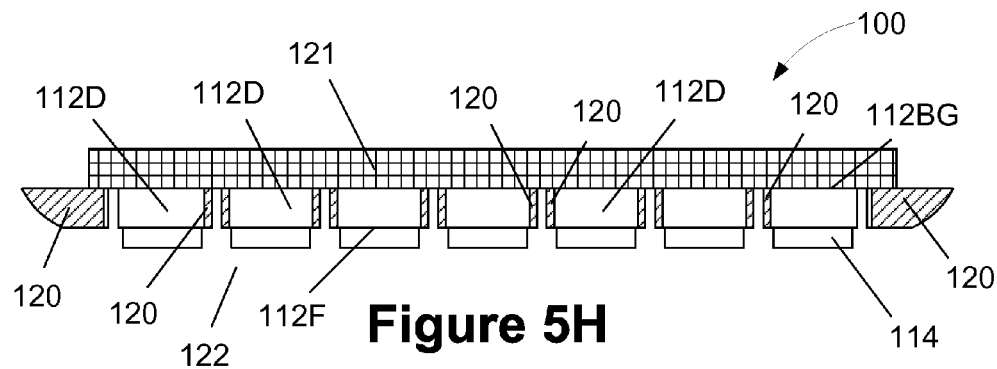
Figure 5I:
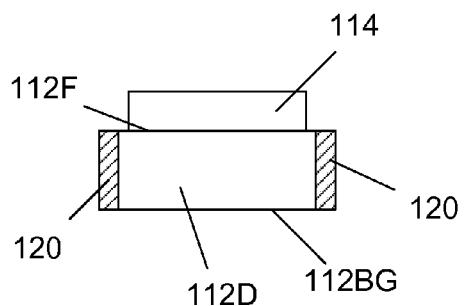

FIG. 5G depicts the device after the heating/cooling processes described above have been performed to from the amorphous regions 120 in all desired scribe line regions 116A on the substrate 112 and after a layer of dicing tape 121 has been attached to the die 114 on the back side 112BG of the wafer 100. Note that, in the embodiment depicted herein, the amorphous regions 120 do not span the entire width of the scribe line regions 116A, although they may in other applications. FIG. 5H depicts the wafer 100 after traditional dicing operations have been performed to physically separate the illustrative die 114 formed on the substrate 112, wherein each of the die 114 are positioned on a separated portion 112D of the substrate 112. FIG. 5I is an enlarged view of one of the illustrative integrated circuit products 114 after the dicing operations were performed. As depicted, the die 114 is positioned on the front side 112F of the substrate 112D that has amorphous regions 120 on the ends thereof.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a plurality of die above a crystalline semiconducting substrate, said substrate having a thickness;
   irradiating and cooling an edge region of said substrate to form an amorphous region in said edge region of said substrate; and
   after forming said amorphous region, performing at least one process operation to reduce said thickness of said substrate.

2. The method of claim 1, wherein said substrate is comprised of silicon and said amorphous region is comprised of amorphous silicon.

3. The method of claim 1, wherein irradiating said edge region of said substrate comprises irradiating said substrate with radiation at a wavelength that falls within the range of 249-10,600 nm.

4. The method of claim 1, wherein cooling said edge region comprises cooling said edge region at a cooling rate of at least $10^4$ K/s.

5. The method of claim 1, wherein cooling said edge region comprises directing a cooling fluid at a temperature of at least −100 K toward said edge region.

6. The method of claim 1, further comprising moving said substrate during said irradiating and cooling steps.

7. The method of claim 1, wherein said step of performing said at least one process operation to reduce said thickness of said substrate comprises performing a grinding process operation on a back surface of said substrate to reduce said thickness of said substrate.

8. The method of claim 1, further comprising, after forming said amorphous region, performing a grinding process operation on a front side of said substrate and on said amorphous region.

9. The method of claim 1, wherein cooling said edge region comprises directing a cooling fluid at said edge region.

10. A method, comprising:
    forming a plurality of die above a crystalline semiconducting substrate, said substrate having a thickness;
    irradiating an edge region of said substrate to form an annealed region in said edge region of said substrate;
    cooling said annealed region to thereby form an amorphous region in said edge region of said substrate; and
    after forming said amorphous region, performing at least one process operation to reduce said thickness of said substrate.

11. The method of claim 10, wherein irradiating said edge region of said substrate comprises irradiating said substrate with radiation at a wavelength that falls within the range of 249-10,600 nm.

12. The method of claim 11, wherein cooling said annealed region comprises cooling said annealed region at a cooling rate of at least $10^4$ K/s.

13. The method of claim 12, wherein cooling said annealed region comprises directing a cooling fluid at a temperature of at least −100 K toward said annealed region.

14. The method of claim 10, further comprising moving said substrate during said irradiating and cooling steps.

15. The method of claim 10, wherein cooling said annealed region comprises directing a cooling fluid at said annealed region.

16. A method, comprising:
    forming a plurality of die above a crystalline semiconducting substrate, said substrate having a thickness, said plurality of die being separated by a scribe line region;
    irradiating and cooling an edge region of said substrate to form an amorphous region in said edge region of said substrate;
    after forming said amorphous region, performing at least one thinning process operation to reduce said thickness of said substrate to a final desired thickness;
    after performing said at least one thinning operation, irradiating and cooling at least a portion of said scribe line region to form an amorphous region in said scribe line region; and
    after forming said amorphous region, cutting through said scribe line region to separate said plurality of die.

17. The method of claim 16, wherein cooling said edge region and cooling said at least said portion of said scribe line region comprises directing a cooling fluid at said at least said portion of said scribe line region.

* * * * *